United States Patent
Amano

(10) Patent No.: US 7,474,155 B2
(45) Date of Patent: Jan. 6, 2009

(54) POWER AMPLIFIER

(75) Inventor: Yoshihisa Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 108 days.

(21) Appl. No.: 11/708,355

(22) Filed: Feb. 21, 2007

(65) Prior Publication Data
US 2007/0222521 A1  Sep. 27, 2007

(30) Foreign Application Priority Data
Mar. 24, 2006   (JP) ............................. 2006-083100

(51) Int. Cl.
    *H03F 3/68* (2006.01)
(52) U.S. Cl. .................... 330/295; 330/311
(58) Field of Classification Search ............... 330/295, 330/310, 311
    See application file for complete search history.

(56) References Cited

U.S. PATENT DOCUMENTS 6,771,130 B2 *  8/2004  Hasegawa et al. ........... 330/302
7,319,364 B2 *  1/2008  Kim et al. .................... 330/295
2006/0170502 A1 *  8/2006  Cha et al. .................... 330/295

FOREIGN PATENT DOCUMENTS

| JP | 08-084026 | 3/1996 |
| JP | 2002-084144 | 3/2002 |

* cited by examiner

*Primary Examiner*—Steven J Mottola
(74) *Attorney, Agent, or Firm*—Harness, Dickey & Pierce, P.L.C.

(57) ABSTRACT

A power amplifier includes a front-stage amplifier including first and second transistors connected in parallel, and a rear-stage amplifier including a third transistor. The first transistor is biased into near-Class A without a distortion compensation circuit. The second and third transistors are biased into near-Class B with a distortion compensation circuit. The gain characteristics of the first to third transistors are adjusted so that the concave portion of the gain characteristics of the front-stage amplifier and the convex portion of the gain characteristics of the rear-stage amplifier match each other, to thereby flatten the gain characteristic of the entire power amplifier.

3 Claims, 6 Drawing Sheets

POWER AMPLIFIER

This nonprovisional application is based on Japanese Patent Application No. 2006-083100 filed with the Japan Patent Office on Mar. 24, 2006, the entire contents of which are hereby incorporated by reference.

BACKGROUND OF THE INVENTION

1. Field of the Invention

The present invention relates to a power amplifier, and particularly, to a power amplifier including a plurality of amplification stages.

2. Description of the Background Art

In recent years, radio communication systems using a quasi-microwave band or a microwave band, represented by mobile communication systems such as a mobile phone, have rapidly come into wide use. This is greatly attributed to the reduction in weight and power consumption of the mobile terminals. To make the mobile terminal lightweight, it is effective to reduce the weight and capacity of a battery employed therefor. On the other hand, the battery having a small capacity is exhausted in a short time. Thus there has been strong demand for the reduction of power consumption of a transmission power amplifier, which consumes most of the electric power of the mobile terminal in transmission. That is, improvement in electric power efficiency has been strongly demanded for.

In the recent digital modulation and demodulation using OFDM (Orthogonal Frequency Division Multiplexing) modulation technique and the like, the power amplifier is required to amplify an input signal linearly because information is represented by both amplitude and phase of the signal. On the other hand, generally, in the power amplifier, as an output electric power becomes closer to saturation owing to an increase in input electric power, distortion and power efficiency become increasingly high. Thus a high power efficiency and a low distortion are in a reciprocal relationship.

Before the power amplifier is specifically described, first, terms used in the present specification are described. In the present specification, expressions "near-Class A bias", "near-Class B bias" are frequently used, which are generally intended to express certain ranges around "Class A to Class AB bias" and "Class B to Class AB bias", respectively. In recent power amplifiers, it is not unusual that a bias point dynamically changes in accordance with the operating power, and therefore defining the bias point strictly by words may invite unnecessary complication.

Additionally, expressions "without a distortion compensation circuit", "not compensated for distortion", and "not through a distortion compensation circuit" are used. Generally in the field of electric circuits, "without a certain circuit" does not necessarily mean that the circuit is totally physically absent, but it means that the effect is suppressed to be "weak". This holds true for the distortion compensation circuit. For example, if great resistances are inserted in various portions of the circuit to shut off the current, the effect can easily be suppressed to be weak. The above expressions are used in such context.

FIG. 4 is a circuit block diagram showing a configuration of a conventional power amplifier. Such a power amplifier is disclosed in Japanese Patent Laying-Open No. 2002-084144, for example. Referring to FIG. 4, in the power amplifier, two stages of emitter-grounded bipolar transistors 33 and 34 are provided between an input terminal 31 and an output terminal 32. Between input terminal 31 and the base of front-stage transistor 33, a matching circuit 35 is provided. Between the collector of front-stage transistor 33 and the base of rear-stage transistor 34, a matching circuit 36 is provided. Between rear-stage transistor 34 and output terminal 32, a matching circuit 37 is provided. Matching circuits 35-37 are circuits for adjusting reflected power.

To the collectors of transistors 33 and 34, a collector bias voltage is supplied through power supply terminals 38 and 39. To the base of front-stage transistor 33, a bias voltage is supplied through power supply terminal 40 and not through a distortion compensation circuit (to adjust the distortion compensation effect to be weak). To the base of rear-stage transistor 34, a bias voltage is supplied from power supply terminal 41 through a distortion compensation circuit 42 (to adjust the distortion compensation effect to be enhanced). Front-stage transistor 33 is biased into near-Class A, while rear-stage transistor 34 is biased into near-Class B.

There are various types of distortion compensation circuit 42, for example as represented by those shown in FIGS. 5-8. The distortion compensation circuit in FIG. 5 includes a terminal 51 connected to a power supply terminal 41, a terminal 52 connected to the base of transistor 34, a resistor element 53 and a variable impedance element 54 serially connected between terminals 51 and 52, and a resistor element 55 and a capacitor 56 serially connected between a node N53, arranged between resistance element 53 and variable impedance element 54, and a line of ground potential GND.

The distortion compensation circuit shown in FIG. 6 corresponds to the distortion compensation circuit shown in FIG. 5 in which variable impedance element 54 is replaced by a diode 57. Diode 57 has its anode connected to node N53 and has its cathode connected to terminal 52. The distortion compensation circuit in FIG. 7 corresponds to the distortion compensation circuit shown in FIG. 6 in which diode 57 is replaced by a bipolar transistor 58. Transistor 58 has its base connected to node N53 and has its emitter connected to terminal 52. The distortion compensation circuit shown in FIG. 8 corresponds to the distortion compensation circuit shown in FIG. 7 in which resistor element 55 is eliminated and a resistor element 59 is added. Capacitor 56 is connected between node N53 and a line of ground potential GND, and resistor element 59 is connected between node N53 and the collector of transistor 58.

Variable impedance element 54, diode 57, transistor 58 are nonlinear elements that actually serve to compensate for distortion. Resistor element 53 primarily serves to adjust DC current. Resistors 55 and 59 and capacitor 56 primarily serve to adjust nonlinearity.

FIGS. 9A-9C are for describing the principle of distortion compensation in the power amplifier shown in FIG. 4. In each of FIGS. 9A-9C, the axis of abscissa indicates output power [dBm] while the axis of ordinate indicates gain [dB].

FIG. 9A shows the gain characteristic of front-stage transistor 33 without a distortion compensation circuit (with weak distortion compensation effect). The characteristic more or less changes depending on the bias point. When transistor 33 is biased into near-Class A bias, its gain characteristic shows a nonlinear characteristic generally falling rightward.

FIG. 9B shows the gain characteristic of rear-stage transistor 34 to which a distortion compensation circuit 42 is connected. The characteristic greatly changes depending on the bias point. When transistor 34 is biased into near-Class B bias, its gain characteristics shows a nonlinear characteristic generally rising rightward.

FIG. 9C shows the gain characteristic of the entire power amplifier, in which the rightward falling gain characteristic of front-stage transistor 33 and the rightward rising gain characteristic of rear-stage transistor 34 are combined. Adjusting respective gain characteristics of transistors 33 and 34, the nonlinearity of transistor 33 and that of transistor 34 cancel each other, whereby a flat and constant gain characteristic can be implemented. That is, a power amplifier having an excellent linearity can be realized. In FIG. 9C, Section A is the range where gain is flattened.

However, although the conventional power amplifier is effective for achieving linearization in Section A where the output power is relatively small, it is not effective for achieving linearization in Section B where the output power is great and approximating saturation. Hence, further improvement has been required.

Assume an "ideal power amplifier characteristic" in which linearity is ensured closely to the saturation point. It may be represented by the dashed line in FIG. 9C. That is, the right side of the curve indicative of the gain characteristic projects at a right angle.

SUMMARY OF THE INVENTION

Accordingly, a primary object of the present invention is to provide a power amplifier having excellent linearity.

A power amplifier according to the present invention includes a plurality of amplification stages. A first amplification stage in the plurality of amplification stages includes a first amplification element, a second amplification element connected in parallel to the first amplification element, and a first distortion compensation circuit adjusting distortion of a gain characteristic of the second amplification element. A second amplification stage in the plurality of amplification stages includes a third amplification element and a second distortion compensation circuit adjusting distortion of a gain characteristic of the third amplification element. A dependency characteristic of gain relative to output power is opposite between the first amplification element and the second amplification element having the gain characteristic adjusted by the first distortion compensation circuit. A dependency characteristic of gain relative to output power is opposite between the first amplification stage and the third amplification element having the gain characteristic adjusted by the second distortion compensation circuit.

Preferably, the first to third amplification elements are first to third bipolar transistors, respectively. The first and second distortion compensation circuits also serve as bias circuits of the second and third bipolar transistors, respectively.

Preferably, the first bipolar transistor is biased into Class A to Class AB, the second bipolar transistor is biased into Class B to Class AB, and the third bipolar transistor is biased into Class B to Class AB.

In the power amplifier according to the present invention, a first amplification stage in a plurality of amplification stages includes a first amplification element, a second amplification element connected in parallel to the first amplification element, and a first distortion compensation circuit adjusting distortion of a gain characteristic of the second amplification element. A second amplification stage in the plurality of amplification stages includes a third amplification element and a second distortion compensation circuit adjusting distortion of a gain characteristic of the third amplification element. A dependency characteristic of gain relative to output power is opposite between the first amplification element and the second amplification element having the gain characteristic adjusted by the first distortion compensation circuit. A dependency characteristic of gain relative to output power is opposite between the first amplification stage and the third amplification element having the gain characteristic adjusted by the second distortion compensation circuit. Accordingly, it becomes possible to provide a gain characteristic that rises rightward to the first amplification element, and to provide a gain characteristic that falls rightward to the second amplification element, so that a concave type gain characteristic is provided to the first amplification stage and a convex type gain characteristic is provided to the second amplification stage. Thus, by adjusting the gain characteristics so that concave and convex portions of the gain characteristics of the first and second amplification stages, respectively, match each other, a flat gain characteristic for the entire power amplifier can be obtained and a power amplifier having excellent linearity can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
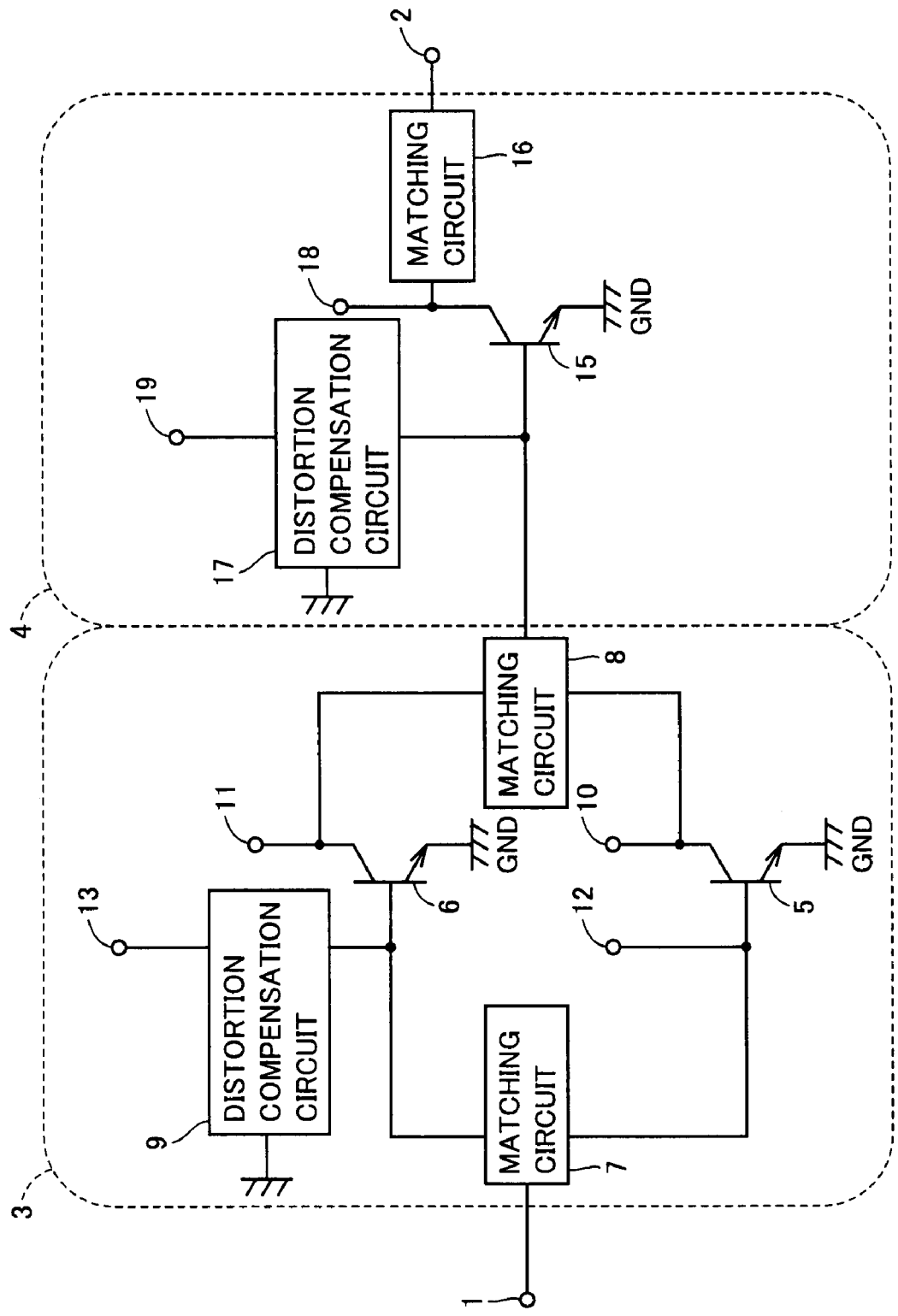
FIG. 1 is a circuit block diagram showing a configuration of a power amplifier according to one embodiment of the present invention.

FIG. 1 is a circuit block diagram showing a configuration of a power amplifier according to one embodiment of the present invention. In FIG. 1, the power amplifier includes two stages of amplifiers 3 and 4 connected between an input terminal 1 and an output terminal 2. Front-stage amplifier 3 includes two emitter-grounded bipolar transistors 5 and 6, three-terminal matching circuits 7 and 8, and a distortion compensation circuit 9, while rear-stage amplifier 4 includes one emitter-grounded bipolar transistor 15, a two-terminal matching circuit 16, and a distortion compensation circuit 17.

Input terminal 1 and the bases of transistors 5 and 6 are coupled by three-terminal matching circuit 7. The collectors of transistors 5 and 6 and the base of transistor 15 are coupled by three-terminal matching circuit 8. The collector of transistor 15 and output terminal 2 are coupled by two-terminal matching circuit 16. Matching circuits 7, 8 and 16 adjust reflected power.

To the collectors of transistors 5, 6 and 15, a collector bias voltage is supplied through power supply terminals 10, 11 and 18. To the base of transistor 5, a bias voltage of near-Class A is supplied from power supply terminal 12 and not through a distortion compensation circuit (so that the distortion compensation effect is weakened). To the base of transistor 6, a bias voltage of near-Class B is supplied from power supply terminal 13 and through a distortion compensation circuit 9 (so that the distortion compensation effect is enhanced). To the base of transistor 15, a bias voltage of near-Class B is supplied from power supply terminal 19 and through a distortion compensation circuit 17 (so that the distortion compensation effect is enhanced). Each of distortion compensation circuits 9 and 17 is one of the distortion compensation circuits shown in FIGS. 5-8.

Figure 2A:
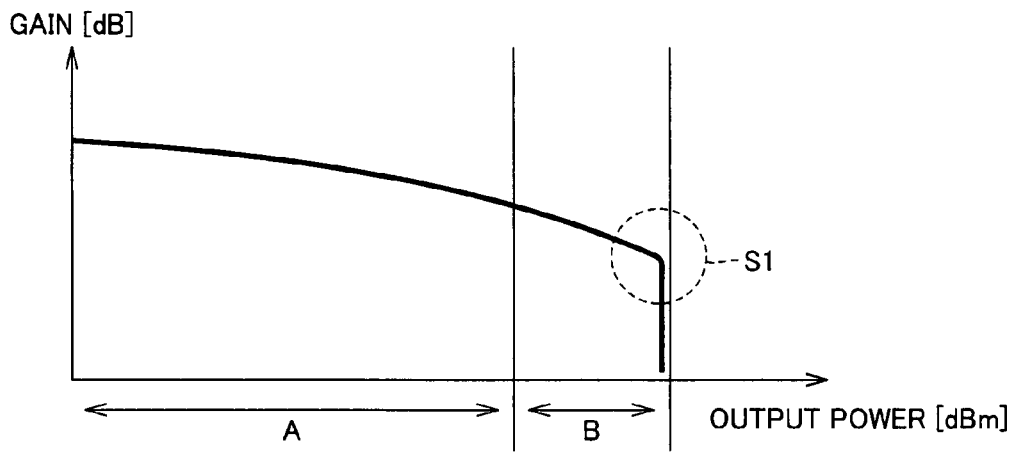
FIGS. 2A-2C show gain characteristics of a front-stage amplifier shown in FIG. 1.
Figure 4:
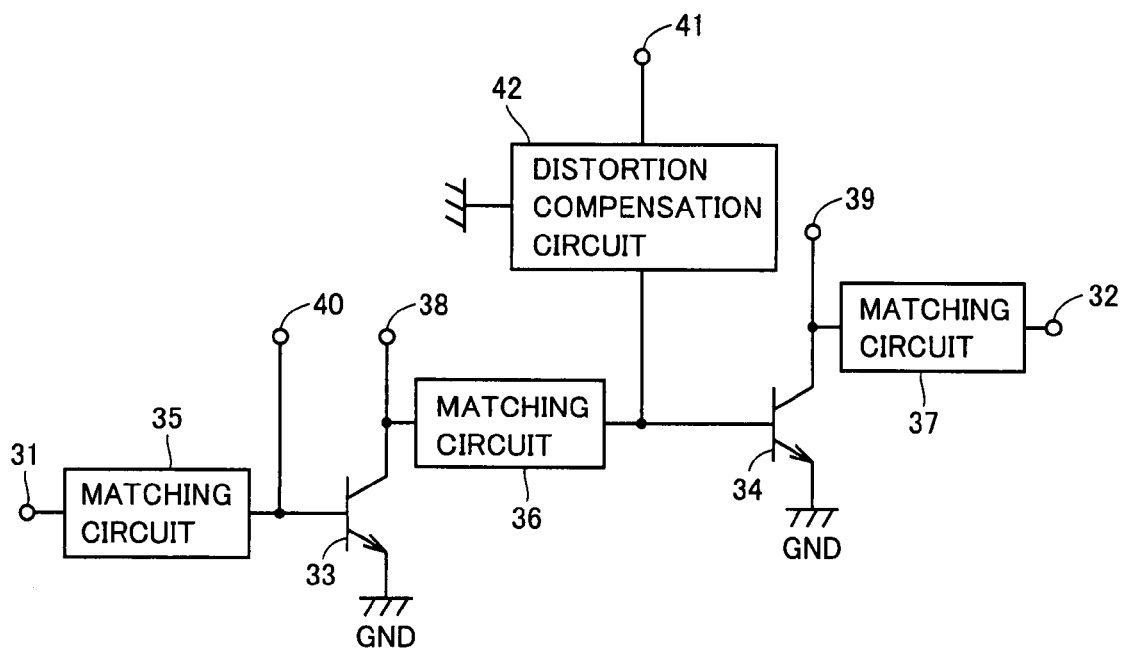
FIG. 4 is a circuit block diagram showing a configuration of a conventional power amplifier.
Figure 5:
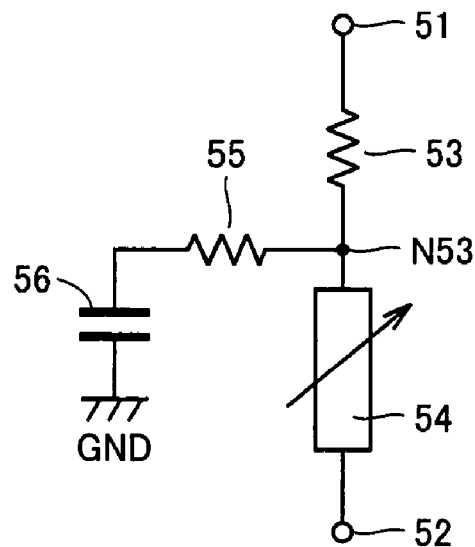
FIG. 5 is a circuit diagram exemplifying a configuration of a distortion compensation circuit shown in FIG. 4.
Figure 6:
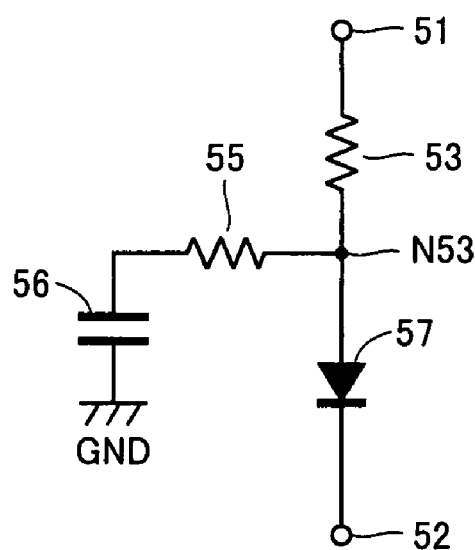
FIG. 6 is another circuit diagram exemplifying a configuration of the distortion compensation circuit shown in FIG. 4.
Figure 7:
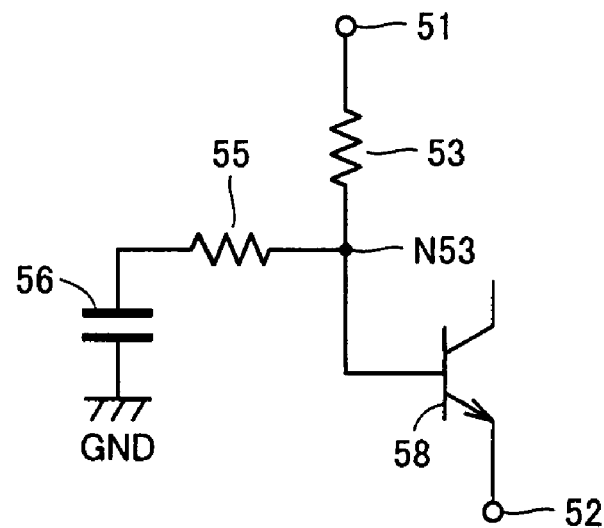
FIG. 7 is still another circuit diagram exemplifying a configuration of the distortion compensation circuit shown in FIG. 4.
Figure 8:
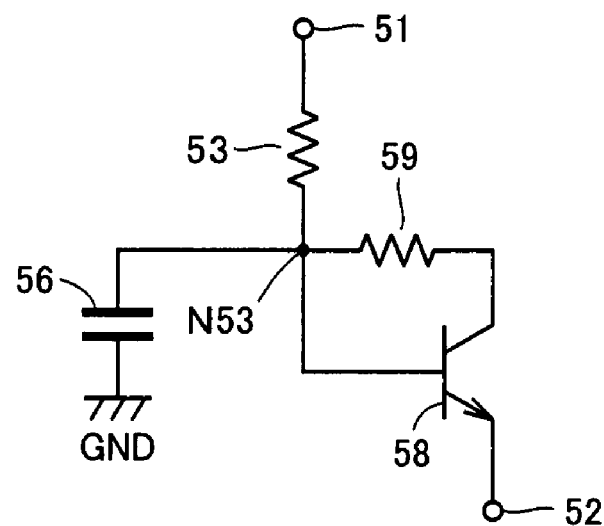
FIG. 8 is still another circuit diagram exemplifying a configuration of the distortion compensation circuit shown in FIG. 4.

Next, the distortion compensation operation of the power amplifier is described. FIG. 2A shows the gain characteristic of transistor 5, which is without a distortion compensation circuit and which is in near-Class A bias, among the constituents of front-stage amplifier 3. Similarly to front-stage transistor 33 in the conventional power amplifier shown in FIG. 4, it shows a nonlinear characteristic that generally falls rightward.

Figure 2B:
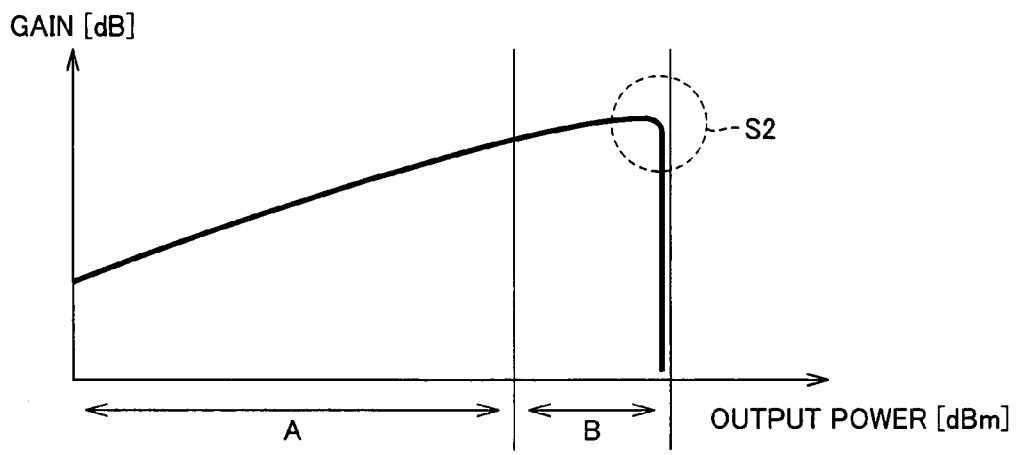

FIG. 2B shows the gain characteristic of transistor 6, which is with a distortion compensation circuit and which is in near-Class B bias, among the constituents of front-stage amplifier 3. Similarly to rear-stage transistor 34 in the conventional power amplifier shown in FIG. 4, it shows a nonlinear characteristic that generally rises rightward.

If the saturation power of front-stage transistors 5 and 6 are set high enough, front-stage transistors 5 and 6 still do not saturate at the time point where rear-stage transistor 15 saturates. Therefore, in FIGS. 2A and 2B where the axis of abscissa indicates the output power of the entire power amplifier, the gain curve often appears as bent discontinuously in each range S1 and S2 near the saturation point. The sharp-edge characteristic of rightward rise in range S2 of discontinuous ranges S1 and S2 plays an important role in the present invention.

Figure 2C:
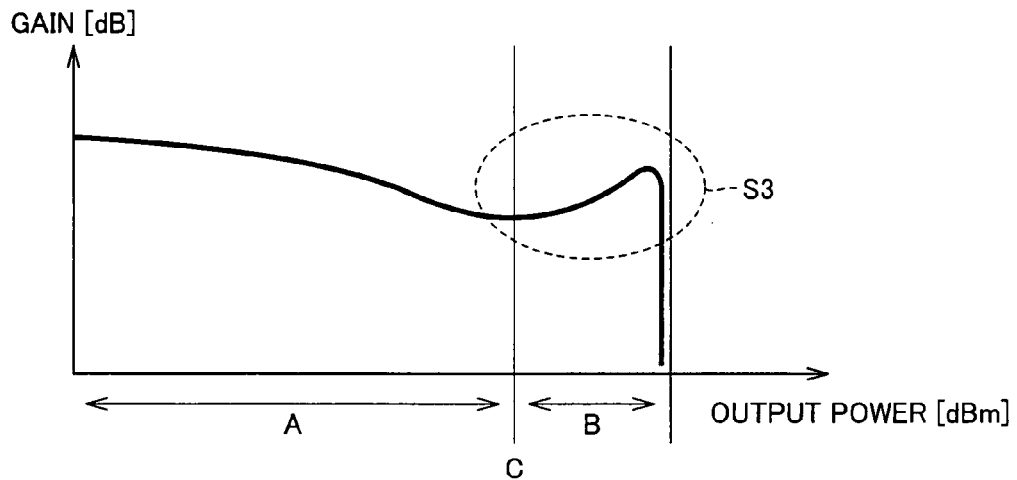

FIG. 2C shows the gain characteristic of the entire front-stage amplifier 3. The gain characteristic of the entire front-stage amplifier 3 is formed by the combination of respective gain characteristics of two transistors 5 and 6. The feature of the gain characteristic in FIG. 3C is that the gain characteristic that falls rightward in Section A where the output power is low jumps up conversely and rises rightward in Section B near the saturation point. At point C where the gain characteristic turns from rightward fall to rightward rise, the relationship between two transistors 5 and 6 in the magnitude of output power, that is, the relationship between two transistors 5 and 6 in the magnitude of gain characteristic, is reversed. As the gain of transistor 5, which is without a distortion compensation circuit and which is in near-Class A bias, is greater relative to the gain of transistor 6, which is with a distortion compensation circuit and which is in near-Class B bias, the position of point C moves greatly to the right side in FIG. 2C. Accordingly, by adjusting the bias of transistors 5 and 6, the position of point C can be moved to a desired position.

Figure 9A:
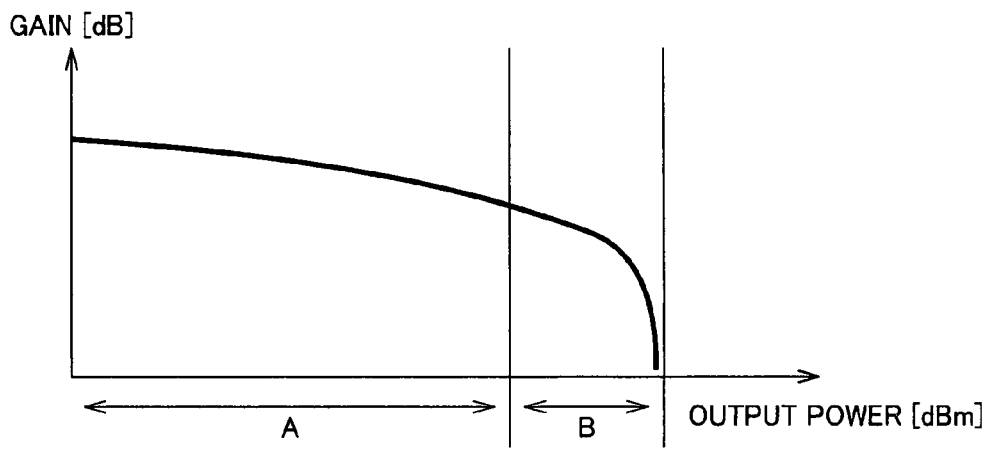
FIGS. 9A-9C show gain characteristics of the power amplifier shown in FIG. 4.
Figure 9B:
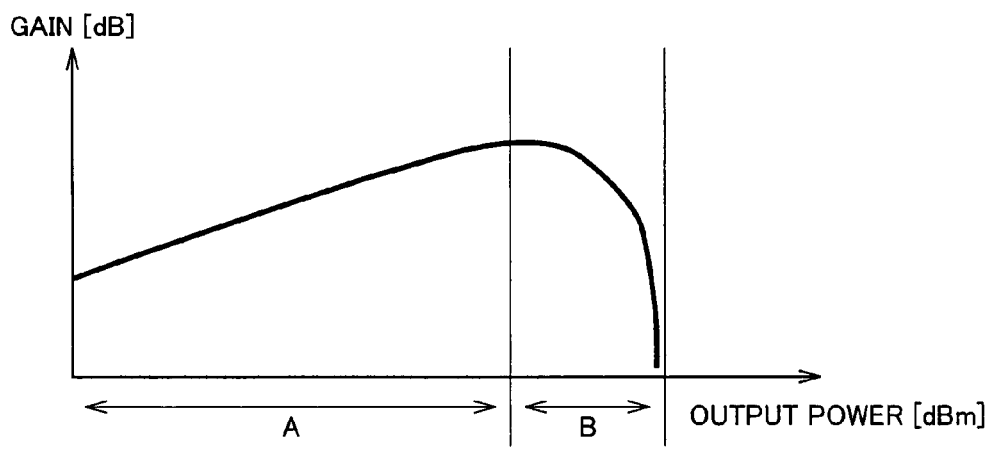
Figure 9C:
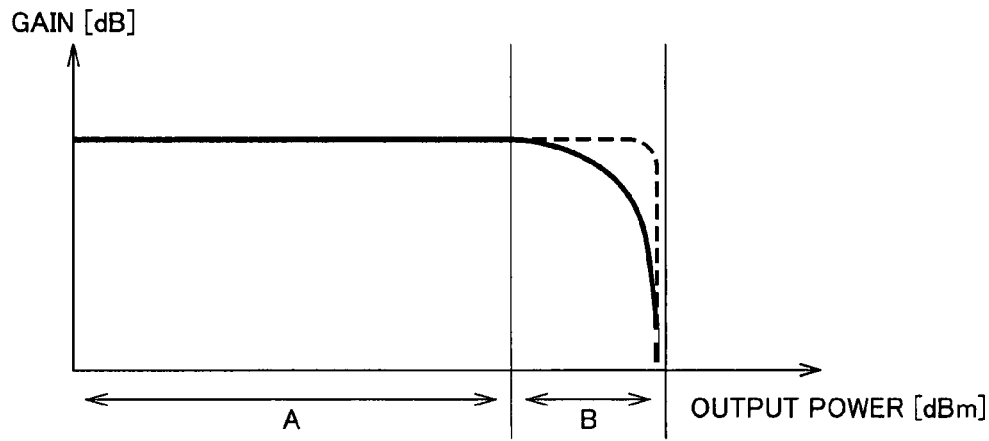

Among two stages of amplifiers 3 and 4, the gain characteristic of rear-stage amplifier 4 is the same as that of the conventional technique shown in FIG. 9B. The gain characteristics of amplifiers 3 and 4 are adjusted so that the convex portion of the gain characteristic of rear-stage amplifier 4 shown in FIG. 9B and the concave portion of the gain characteristic of front-stage amplifier 3 of the present invention shown in FIG. 2C closely match each other. As a result, the gain characteristic of the entire power amplifier can approximate the "ideal power amplifier characteristic" shown by the dashed line in FIG. 9C, going beyond the limit of the conventional technique.

Figure 3:
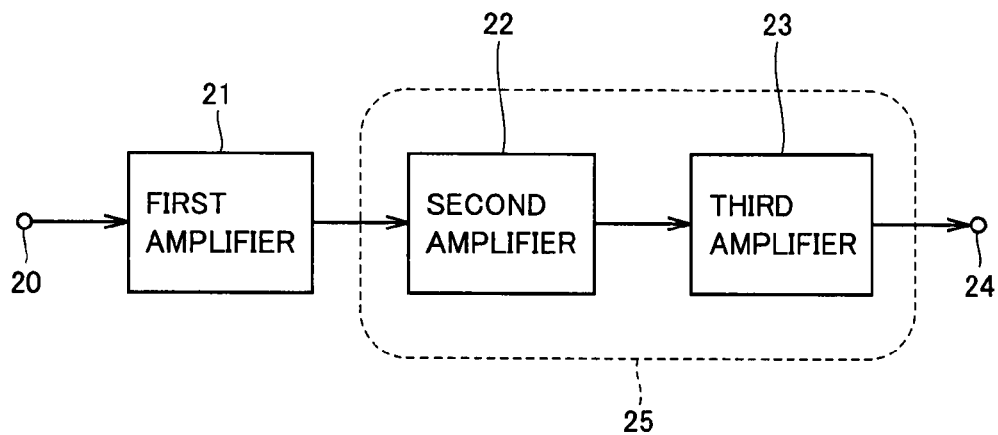
FIG. 3 is a block diagram showing a modification of the embodiment.

While the description has been made referring to FIG. 1 on the example where the present invention is applied to the power amplifier constituted of two stages of amplifiers 3 and 4, the present invention is similarly applicable to a power amplifier constituted of three or more stages of amplifiers. FIG. 3 is a block diagram showing an example where the present invention is applied to a power amplifier constituted by three stages of amplifiers. In FIG. 3, an electric signal provided to an input terminal 20 is sequentially amplified at first to third amplifiers 21-23 and thereafter outputted from output terminal 24. In the power amplifier, to a circuit 25 being the combination of second amplifier 22 and third amplifier 23, the present invention described referring go FIGS. 1 and 2 is applied. With this modification also, the gain characteristic of the power amplifier can be flattened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power amplifier, comprising
   a plurality of amplification stages, wherein
   a first amplification stage in said plurality of amplification stages includes a first amplification element, a second amplification element connected in parallel to said first amplification element, and a first distortion compensation circuit adjusting distortion of a gain characteristic of said second amplification element,
   a second amplification stage in said plurality of amplification stages includes a third amplification element and a second distortion compensation circuit adjusting distortion of a gain characteristic of said third amplification element,
   a dependency characteristic of gain relative to output power is opposite between said first amplification element and said second amplification element having the gain characteristic adjusted by said first distortion compensation circuit, and
   a dependency characteristic of gain relative to output power is opposite between said first amplification stage and said third amplification element having the gain characteristic adjusted by said second distortion compensation circuit.

2. The power amplifier according to claim 1, wherein
   said first to third amplification elements are first to third bipolar transistors, respectively, and
   said first and second distortion compensation circuits also serve as bias circuits of said second and third bipolar transistors, respectively.

3. The power amplifier according to claim 2, wherein
   said first bipolar transistor is biased into Class A to Class AB,
   said second bipolar transistor is biased into Class B to Class AB, and
   said third bipolar transistor is biased into Class B to Class AB.

* * * * *